United States Patent
Suzuki et al.

(10) Patent No.: US 10,506,700 B2
(45) Date of Patent: Dec. 10, 2019

(54) PLASMA TREATMENT APPARATUS

(71) Applicant: Plasma Ion Assist Co., Ltd., Kyoto (JP)

(72) Inventors: Yasuo Suzuki, Otsu (JP); Masayasu Tanjo, Nagaokakyo (JP)

(73) Assignee: Plasma Ion Assist Co., Ltd., Kyoto (JP)

( * ) Notice: Subject to any disclaimer, the term of this patent is extended or adjusted under 35 U.S.C. 154(b) by 0 days.

(21) Appl. No.: 16/224,813

(22) Filed: Dec. 19, 2018

(65) Prior Publication Data

US 2019/0261500 A1 Aug. 22, 2019

(30) Foreign Application Priority Data

Feb. 16, 2018 (JP) .................................. 2018/025726
Oct. 23, 2018 (JP) .................................. 2018/199522

(51) Int. Cl.
*H05H 1/24* (2006.01)
*H01J 37/32* (2006.01)
*B29C 59/14* (2006.01)
*B32B 15/04* (2006.01)
*C23C 16/54* (2006.01)

(52) U.S. Cl.
CPC ............... *H05H 1/24* (2013.01); *B29C 59/14* (2013.01); *B32B 15/04* (2013.01); *C23C 16/545* (2013.01); *H01J 37/32009* (2013.01)

(58) Field of Classification Search
None
See application file for complete search history.

(56) References Cited

U.S. PATENT DOCUMENTS

2008/0309242 A1* 12/2008 Ellingboe ......... H01J 37/32082
315/111.51
2011/0195207 A1* 8/2011 Hong ..................... C23C 16/26
428/34.1

FOREIGN PATENT DOCUMENTS

JP 2015185494 10/2015

* cited by examiner

*Primary Examiner* — Dedei K Hammond
(74) *Attorney, Agent, or Firm* — JCIPRNET

(57) ABSTRACT

In order to ensure quality even when a sheet-like base material is thin while improving efficiency of production, a plasma treatment apparatus disclosed herein includes a plasma treatment chamber X for treating a sheet-like base material Z with plasma, a high-frequency antenna 3 for generating plasma in the plasma treatment chamber X, and a feeding mechanism 10 for feeding the sheet-like base material Z into the plasma treatment chamber X in a vertical direction.

7 Claims, 6 Drawing Sheets

PLASMA TREATMENT APPARATUS

CROSS-REFERENCE TO RELATED APPLICATION

This application claims the priority benefit of Japan application no. 2018-025726, filed on Feb. 16, 2018, and Japan application no. 2018-199522, filed on Oct. 23, 2018. The entirety of each of the above-mentioned patent applications is hereby incorporated by reference herein and made a part of this specification.

BACKGROUND

Technical Field

The disclosure relates to a plasma treatment apparatus that performs plasma treatment such as deposition on a sheet-like base material.

Description of Related Art

As this type of plasma treatment apparatus, there is a so-called roll-to-roll type capable of continuously depositing a sheet-like base material, and according to this method, a deposition rate is high and productivity can be improved compared to intermittent film deposition called a cassette-to-cassette method.

As a plasma treatment apparatus of the roll-to-roll type, as described in Patent Document 1 (Japanese Laid-Open No. 2015-185494), there is a plasma treatment apparatus including a feeding roller which feeds a sheet-like base material and a winding roller which winds the sheet-like base material, and configured to perform plasma treatment in a plasma treatment chamber while transferring the sheet-like base material in a horizontal direction.

However, with the above-described configuration, since the sheet-like base material is heated by the energy of ions in the plasma and is softened during plasma treatment and the softened sheet-like base material is pulled by a winding roller such that it does not bend, the sheet-like base material shrinks toward a center portion in a width direction. As a result, wrinkles may occur in the sheet-like base material. Such a problem becomes more noticeable when the sheet-like base material is thin.

SUMMARY

The disclosure has been made capable of preventing occurrence of wrinkles even when a sheet-like base material is thin while improving productivity.

That is, a plasma treatment apparatus according to the disclosure includes a plasma treatment chamber which treats a sheet-like base material with plasma, a high-frequency antenna which generates plasma in the plasma treatment chamber, and a feeding mechanism which feeds the sheet-like base material into the plasma treatment chamber in a vertical direction.

According to the plasma treatment apparatus configured as described above, since the feeding mechanism feeds the sheet-like base material to the plasma treatment chamber in the vertical direction, bending of the sheet-like base material during plasma treatment can be reduced.

Accordingly, since tension applied to the sheet-like base material can be reduced while improving productivity by continuously feeding the sheet-like base material, occurrence of wrinkles can be prevented even when the sheet-like base material is thin.

The feeding mechanism may be provided above the plasma treatment chamber.

According to the plasma treatment apparatus configured as described above, since the feeding mechanism provided above the plasma treatment chamber feeds the sheet-like base material downward, the sheet-like base material is lowered by its own weight without pulling from below.

Thereby, the tension applied to the sheet-like base material can be made as small as possible, and occurrence of wrinkles can be prevented.

On the other hand, when the feeding mechanism is provided above the plasma treatment chamber, work for loading and unloading the sheet-like base material to or from the feeding mechanism becomes difficult.

Therefore, in order to improve workability, the plasma treatment apparatus may further include a winding mechanism which winds the sheet-like base material that has passed through the plasma treatment chamber in the vertical direction, in which the feeding mechanism and the winding mechanism are provided below the plasma treatment chamber.

According to such a configuration, it is possible to facilitate loading and unloading of the sheet-like base material with respect to the feeding mechanism and the winding mechanism.

When the sheet-like base material that has been treated with plasma is wound around a winding roller, wrinkles tend to occur due to the tension applied to the sheet-like base material heated by the energy of ions in the plasma.

Therefore, in order to prevent occurrence of wrinkles while winding the sheet-like base material that has been treated with plasma, the plasma treatment apparatus may include a winding roller which winds the sheet-like base material, and a cooling roller which cools the sheet-like base material that has been treated with plasma while guiding the sheet-like base material to the winding roller.

With such a configuration, even when tension is applied to the sheet-like base material, occurrence of wrinkles can be prevented by cooling the sheet-like base material before being wound around the winding roller.

The reason why wrinkles occur in the sheet-like base material is that, as described above, the sheet-like base material shrinks toward a center in the width direction when the sheet-like base material heated due to various factors is pulled.

Therefore, in order to inhibit the shrinkage of the sheet-like base material toward the center in the width direction, the plasma treatment apparatus may further include a guide roller which guides the sheet-like base material that has been treated with plasma to the cooling roller, in which the guide roller is configured to receive an outer end portion in a width direction of the sheet-like base material being lowered first before a center portion in the width direction of the sheet-like base material.

When the guide roller has such a shape, since the sheet-like base material that has reached the guide roller is pulled outward in the width direction, shrinkage to the center in the width direction can be inhibited and the sheet-like base material can be guided to the cooling roller without occurrence of wrinkles.

The plasma treatment apparatus may further include a tension detection mechanism which detects a tension applied to the sheet-like base material by using the winding roller, and a control device which controls at least one of the feeding mechanism and the winding roller on the basis of the tension detected by the tension detection mechanism.

With such a configuration, it is possible to control a speed of feeding and winding the sheet-like base material such that it is a speed at which wrinkles do not occur.

As a specific embodiment in which the above-described operation and effects are more significantly exhibited, a configuration in which a heater which heats the sheet-like base material is provided in the plasma treatment chamber can be exemplified.

Incidentally, a slit for transferring the sheet-like base material fed by the feeding mechanism into the plasma treatment chamber and a slit for transferring the sheet-like base material that has been treated with plasma out of the plasma treatment chamber are formed in the plasma treatment chamber. These slits may have a small width in order to reduce a leakage amount of a raw material gas supplied to the plasma treatment chamber.

However, when the sheet-like base material is lowered by its own weight, the sheet-like base material may be shaken, causing a problem of rubbing against the slit and being scratched.

Therefore, a slit through which the sheet-like base material is able to pass may be formed in facing walls of the plasma treatment chamber facing each other, and a pair of guide plates which guide transfer of the sheet-like base material may be further provided in the slit.

With such a configuration, even when the sheet-like base material is shaken, the sheet-like base material can be prevented from rubbing against the slit due to the guide plates, and damage to the sheet-like base material can be prevented.

The plasma treatment apparatus may include a chamber to which a gas different from a raw material gas supplied to the plasma treatment chamber is supplied, and a decompression chamber interposed between the chamber and the plasma treatment chamber and configured to have a reduced pressure with respect to that of the chamber and the plasma treatment chamber.

With such a configuration, since the decompression chamber is interposed between the two chambers, it is possible to prevent a raw material gas and a different type of gas from mixing together.

According to the disclosure with such a configuration as above, occurrence of wrinkles can be prevented even when the sheet-like base material is thin while improving productivity.

DESCRIPTION OF THE EMBODIMENTS

Hereinafter, one embodiment of a plasma treatment apparatus according to the disclosure will be described with reference to the drawings.

A plasma treatment apparatus 100 of the present embodiment is used, for example, to produce a fuel cell separator, and here, a gas barrier film having corrosion resistance with respect to acids or alkalis is deposited on a sheet-like base material Z.

Here, the sheet-like base material Z is, for example, aluminum having a thickness of about 20 μm, and the gas barrier film is, for example, a conductive diamond-like carbon (DLC) film that has conductivity and inhibits permeation of oxygen and water vapor. However, the sheet-like base material Z or the gas barrier film is not limited to those described above, and various types may be selected.

Figure 1:
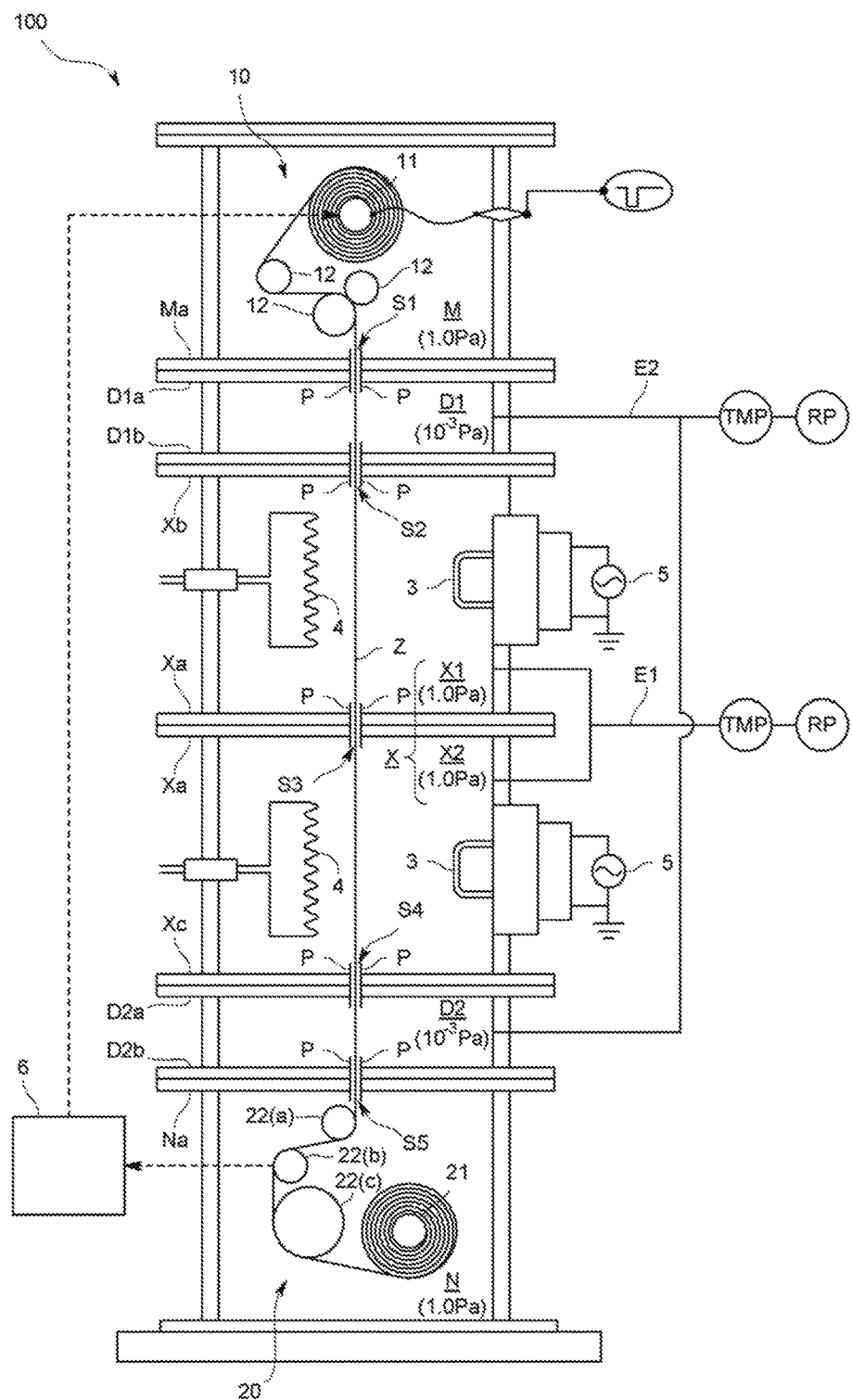
FIG. 1 is a schematic view illustrating a configuration of a plasma treatment apparatus according to the present embodiment.

Specifically, the plasma treatment apparatus 100 may be of a so-called roll-to-roll type, and include a feeding mechanism 10 for feeding the sheet-like base material Z, a plasma treatment chamber X for treating the fed out sheet-like base material Z with plasma, and a winding mechanism 20 for winding the sheet-like base material Z that has been treated with plasma, as illustrated in FIG. 1.

The feeding mechanism 10 feeds the sheet-like base material Z from a coiled material in which the sheet-like base material Z is wound, and includes at least a feeding roller 11 around which the coiled material is mounted. The feeding roller 11 is electrically connected to the set coiled material, and a negative direct current (DC) voltage or negative pulse voltage in plasma treatment to be described below is applied thereto from a bias power supply (not illustrated).

The feeding mechanism 10 is housed in a feeding chamber M exhausted by a first exhaust system E1 in which, for example, a turbo molecular pump TMP, a rotary pump RP, and the like are provided, and a first slit S1 through which the sheet-like base material Z fed out by the feeding roller 11 passes is formed in the feeding chamber M. For example, nitrogen gas is supplied to the feeding chamber M of the present embodiment and maintained at a pressure of 1 Pa, but types of gas to be supplied and a pressure to be maintained are not limited thereto.

Further, the feeding mechanism 10 includes a plurality of guide rollers 12 for guiding the sheet-like base material Z fed out from the feeding roller 11 to the slit. These guide rollers 12 are rotatable and are illustrated as being three guide rollers 12 here, but the number of guide rollers 12 is not limited thereto, and the guide rollers 12 do not necessarily need to be used.

Also, the feeding mechanism 10 of the present embodiment is provided above the plasma treatment chamber X and feeds the sheet-like base material Z downward. Specifically, it is configured such that the above-described feeding chamber M is positioned above the plasma treatment chamber X, and the sheet-like base material Z having passed through the first slit S1 formed in a lower wall Ma of the feeding chamber M is lowered in a vertical direction by its own weight and directed toward the plasma treatment chamber X.

When the sheet-like base material Z is lowered by its own weight, there is a likelihood that the sheet-like base material Z will be easily shaken, and scratched by rubbing against the first slit S1. Thus, a pair of guide plates P for guiding transfer of the sheet-like base material Z are provided in the first slit S1. These guide plates P are provided to face each other to sandwich the sheet-like base material Z passing through the first slit S1, and extend in a transfer direction of the sheet-like base material Z, that is, upward and downward in a vertical direction of the first slit S1. Since the sheet-like base material Z comes in contact with the guide plates P when a distance between the guide plates P is too small, and a gas supplied to the feeding chamber M is likely to leak when the distance between the guide plates P is too large, the distance between the guide plates P is, for example, 1 mm or more and 5 mm or less, or 2 mm. The distance between the guide plates P and a width of the first slit S1 are almost the same.

The plasma treatment chamber X is exhausted by the first exhaust system E1 described above, and includes a high-frequency antenna 3 which generates plasma in the plasma treatment chamber X and a heater 4 for heating the sheet-like base material Z transferred to the plasma treatment chamber X. A raw material gas of plasma is supplied to the plasma treatment chamber X and maintained at a predetermined pressure. Types of gas supplied to the plasma treatment chamber X and a pressure to be maintained are not limited to those to be described below, and may be changed as appropriate.

In the present embodiment, two plasma treatment chambers X for performing different types of plasma treatment are provided in series in the transfer direction of the sheet-like base material Z. These plasma treatment chambers X are vertically adjacent to each other with a partition wall Xa interposed therebetween, and hereinafter, the upper plasma treatment chamber X is referred to as a first plasma treatment chamber X1 and the lower plasma treatment chamber X is referred to as a second plasma treatment chamber X2. Further, the first plasma treatment chamber X1 and the second plasma treatment chamber X2 are exhausted by the common first exhaust system E1, but they may be exhausted using separate exhaust systems. Here, both the high-frequency antenna 3 of the first plasma treatment chamber X1 and the high-frequency antenna 3 of the second plasma treatment chamber X2 are provided on one surface side (surface side) of the sheet-like base material Z, but the high-frequency antenna 3 of the first plasma treatment chamber X1 may be provided on one surface side (surface side) of the sheet-like base material Z and the high-frequency antenna 3 of the second plasma treatment chamber X2 may be provided on the other surface side (back surface side) of the sheet-like base material Z.

The first plasma treatment chamber X1 is a chamber for forming nuclei (such as a hair root in a hair) on the sheet-like base material Z in order to improve adhesion of the conductive DLC film to be described below. More specifically, in the first plasma treatment chamber X1, a carbon compound gas such as methane is supplied as a raw material gas and maintained at a pressure of 1 Pa, and, when high-frequency power is applied from a high-frequency power supply 5 to the high-frequency antenna 3 via a matching device (not illustrated), a discharge plasma containing carbon ions is generated in the vicinity of a surface of the sheet-like base material Z. Then, by applying a negative DC voltage or a negative pulse voltage to the sheet-like base material Z via the above-described feeding roller 11, carbon ions are implanted into the surface of the sheet-like base material Z and nuclei are formed.

This first plasma treatment chamber X1 is positioned below the feeding chamber M, and is configured such that the sheet-like base material Z lowered from the feeding chamber M is carried in by passing through a second slit S2 formed in an upper wall Xb, and the sheet-like base material Z in which nuclei are formed is carried out by passing through a third slit S3 formed in the partition wall Xa serving as a lower wall. Further, in the second slit S2 and the third slit S3, a pair of guide plates P are provided similarly to the first slit S1 described above, and a distance between these guide plates P is, for example, 1 mm or more and 5 mm or less, or 2 mm, for the reason described above.

Incidentally, a raw material gas supplied to the first plasma treatment chamber X1 and a gas supplied to the feeding chamber M described above are different from each other. Therefore, when the first plasma treatment chamber X1 and the feeding chamber M are assumed to be adjacent to each other with the partition wall in which the slit is formed therebetween, in a case in which there is a pressure difference between the chambers, a gas in a chamber with a higher pressure flows into a chamber with a lower pressure through the slit and then different types of gas are mixed. As a result, for example, when methane serving as a raw material gas flows into the feeding chamber M, plasma is generated due to the above-described negative DC voltage or negative pulse voltage applied to the sheet-like base material Z, and a film is formed on the sheet-like base material Z. This film is an insulating film caused by a lower temperature in the feeding chamber M than in the first plasma treatment chamber X1, and causes a decrease in conductivity of a gas barrier film to be described below.

Therefore, a first decompression chamber D1 in which a pressure is reduced with respect to that of the first plasma treatment chamber X1 and the feeding chamber M is interposed therebetween. The first decompression chamber D1 includes the above-described first slit S1 formed in an upper wall D1a and the above-described second slit S2 formed in a lower wall D1b, and is maintained, for example, at a pressure of $10^{-3}$ Pa by being exhausted with a second exhaust system E2 in which a turbo molecular pump TMP, a rotary pump RP, and the like are provided. The reason why the first decompression chamber D1 is maintained at a pressure different from that of the first plasma treatment chamber X1 and the feeding chamber M as described above is because a width of the first slit S1 or the second slit S2 through which these chambers communicate is made extremely small (for example, 1 mm or more and 5 mm or less, or 2 mm), and the first exhaust system E1 for exhausting the feeding chamber M and the first plasma treatment chamber X1, and the second exhaust system E2 for exhausting the first decompression chamber D1 are separately provided.

As a result, even when a raw material gas supplied to the first plasma treatment chamber X1 flows into the first decompression chamber D1, since the raw material gas is exhausted from the first decompression chamber D1, the raw material gas does not flow into the feeding chamber M, and even when a gas supplied to the feeding chamber M flows into the first decompression chamber D1, since the gas is exhausted from the first decompression chamber D1, the gas does not flow into the first plasma treatment chamber X1. Therefore, the gases supplied to the respective chambers M and X1 can be prevented from mixing. Formation of an insulating film on the sheet-like base material Z due to methane serving as the raw material gas flowing into the feeding chamber M can be prevented, and conductivity of a gas barrier film to be described below can be secured.

The second plasma treatment chamber X2 is a chamber in which a conductive DLC film as the gas barrier film is formed on the sheet-like base material Z which has been treated with plasma in the first plasma treatment chamber X1. More specifically, in the second plasma treatment chamber X2, for example, a mixed gas of methane and acetylene is supplied as a raw material gas and maintained at a pressure of 1 Pa, and, when high-frequency power is applied from the high-frequency power supply 5 to the high-frequency antenna 3 via a matching device (not illustrated), a discharge plasma containing carbon ions is generated in the vicinity of the surface of the sheet-like base material Z. In this case, in order to make the conductive DLC film conductive, here, the sheet-like base material Z is heated to 150 to 400° C. using the heater 4 on its underlayer. Then, a negative DC voltage or a negative pulse voltage is applied to the sheet-like base material Z via the above-described feeding roller 11, the sheet-like base material Z is additionally heated by the heater 4 and the energy of ions in the plasma, and thereby a conductive DLC film is formed on the surface of the sheet-like base material Z. Further, the heating with the energy of ions in the plasma is caused by ions in the plasma being implanted into the sheet-like base material Z and kinetic energy of the ions being converted into heat, and when the sheet-like base material Z is as thin as, for example, about 20 μm, a heat capacity of the sheet-like base material Z is small and the heating becomes more noticeable.

The second plasma treatment chamber X2 is positioned below the first plasma treatment chamber X1, and is configured such that the sheet-like base material Z that has been treated with plasma in the first plasma treatment chamber X1 is carried in by passing through the third slit S3 formed in the partition wall Xa serving as an upper wall, and the sheet-like base material Z on which the conductive DLC film is formed is carried out by passing through a fourth slit S4 formed on a lower wall Xc. Further, a pair of guide plates P are provided in the fourth slit S4 similarly to the first slit S1 described above, and a distance between these guide plates P is, for example, 1 mm or more and 5 mm or less, and or 2 mm, for the reason described above.

The sheet-like base material Z having been treated with plasma as described above, that is, the sheet-like base material Z on which the conductive DLC film is formed is wound by the winding mechanism 20 provided below the second plasma treatment chamber X2.

The winding mechanism 20 includes at least a winding roller 21 for winding up the sheet-like base material Z in a coil shape, and is housed in a winding chamber N positioned below the second plasma treatment chamber X2. The winding chamber N is exhausted by the first exhaust system E1 described above, and a fifth slit S5 through which the sheet-like base material Z that has been treated with plasma passes is formed in an upper wall Na. Further, the exhaust system exhausting the winding chamber N may be separate from the first exhaust system E1. In the winding chamber N of the present embodiment, for example, nitrogen gas is supplied and maintained at a pressure of 1 Pa, but types of gas to be supplied and a pressure to be maintained are not limited thereto.

A second decompression chamber D2 is interposed between the winding chamber N and the second plasma treatment chamber X2, similarly to between the first plasma treatment chamber X1 and the feeding chamber M described above. The second decompression chamber D2 includes the above-described fourth slit S4 formed in an upper wall D2a and the above-described fifth slit S5 formed in a lower wall D2b, and is maintained, for example, at a pressure of $10^{-3}$ Pa by being exhausted with a second exhaust system E2 in which a turbo molecular pump TMP and the like are provided. Here, the second decompression chamber D2 is exhausted by the second exhaust system E2, which is shared by the first decompression chamber D1. The reason why the second decompression chamber D2 is maintained at a pressure different from that of the second plasma treatment chamber X2 and the winding chamber N is the same as that for the first decompression chamber D1 described above.

As a result, even when a raw material gas supplied to the second plasma treatment chamber X2 flows into the second decompression chamber D2, since the raw material gas is exhausted from the second decompression chamber D2, the raw material gas does not flow into the winding chamber N, and even when a gas supplied to the winding chamber N flows into the second decompression chamber D2, since the gas is exhausted from the second decompression chamber D2, the gas does not flow into the second plasma treatment chamber X2. Therefore, the gases supplied to the respective chambers X2 and N can be prevented from mixing.

Further, the winding mechanism 20 of the present embodiment includes a plurality of guide rollers 22 for guiding the sheet-like base material Z having passed through the fifth slit S5 to the winding roller 21. Here, three guide rollers 22 are illustrated, but the number of guide rollers 22 is not limited thereto. Hereinafter, to distinguish these guide rollers 22, they are referred to as a first guide roller 22(*a*), a second guide roller 22(*b*), and a third guide roller 22(*c*) from an upstream side in the transfer direction.

Figure 2:
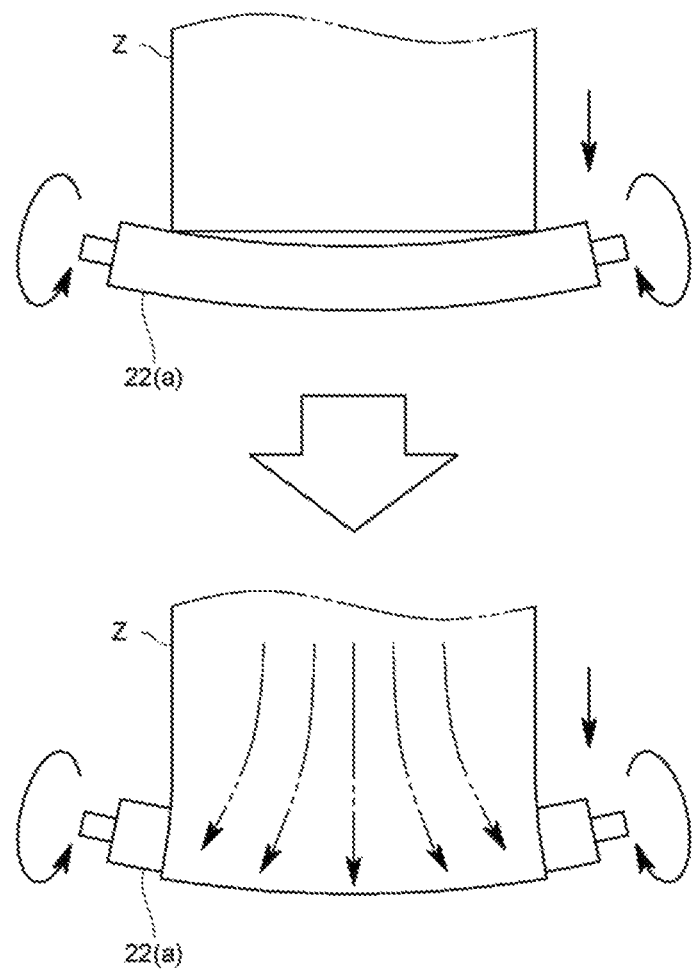
FIG. 2 is a schematic view illustrating a configuration of a first guide roller according to the present embodiment.

The first guide roller 22(*a*) is a rotatable roller that receives the sheet-like base material Z having passed through the fifth slit S5 and guides the sheet-like base material Z to the second guide roller 22(*b*). The first guide roller 22(*a*) is curved to receive an outer end portion in a width direction of the sheet-like base material Z being lowered first before a center portion in the width direction of the sheet-like base material Z. Specifically, the first guide roller 22(*a*) rotates while maintaining a state in which it is curved in an arcuate shape to bulge downward as illustrated in FIG. 2, and extends or acts to extend the sheet-like base material Z outward in the width direction.

The second guide roller 22(*b*) guides the sheet-like base material Z to the third guide roller 22(*c*) and constitutes a tension detection mechanism (not illustrated) for detecting a tension applied to the sheet-like base material Z. Specifically, the second guide roller 22(*b*) is a so-called tension roller configured to move, for example, in a radial direction in accordance with the tension applied to the sheet-like base material Z, and constitutes a tension detection mechanism together with a detection element (not illustrated) such as a piezo element or the like that detects a movement amount.

The detected tension detected by the tension detection mechanism is output to a control device 6 as illustrated in FIG. 1, and the control device 6 compares the detected tension with a preset target tension and controls, for example, a rotation speed of the feeding roller 11 such that the detected tension approaches the target tension. Further, the control device 6 may be configured to control a rotation speed of the winding roller 21 so that the detected tension approaches the target tension.

The third guide roller 22(*c*) is a rotatable roller for cooling the sheet-like base material Z while guiding the sheet-like base material Z to the winding roller 21. Specifically, the third guide roller 22(*c*) is a cooling (water-cooling) roller in which a flow path through which a cooling liquid such as water flows is formed.

According to the plasma treatment apparatus 100 of the present embodiment configured as described above, since the feeding mechanism 10 provided above the plasma treatment chamber X feeds the sheet-like base material Z downward in the vertical direction and the sheet-like base material Z is lowered by its own weight, a tension applied to the sheet-like base material Z can be made as small as possible.

Thus, when the sheet-like base material Z is thin, although the sheet-like base material Z is additionally heated by the energy of the ions in which the ions are accelerated and increased due to the energy of the ions in the plasma or a bias voltage, in addition to the heater 4, a tension for winding the sheet-like base material Z that has been treated with plasma can be reduced to a minimum. As a result, productivity can be improved by the roll-to-roll type, and occurrence of wrinkles on the film formed on the sheet-like base material Z can be prevented.

Also, since the first guide roller 22(a) is curved to receive an outer end portion in the width direction of the sheet-like base material Z being lowered first before a center portion in the width direction of the sheet-like base material Z, the sheet-like base material Z that has reached the first guide roller 22(a) can be pulled outward in the width direction, and the sheet-like base material Z can be guided to the second guide roller 22(b) while inhibiting occurrence of wrinkles.

Further, since the tension applied to the sheet-like base material Z is detected by using a tension roller as the second guide roller 22(b) and a rotation speed of the feeding roller 11 is controlled on the basis of the detected tension, the sheet-like base material Z can be fed out while the tension applied to the sheet-like base material Z is reduced to such an extent that wrinkles do not occur.

In addition, since the cooling roller is used as the third guide roller 22(c) and the sheet-like base material Z heated by the heater or the energy of ions in the plasma can be cooled before being wound around the winding roller 21, occurrence of wrinkles when the sheet-like base material Z is wound can be more reliably prevented.

Further, the disclosure is not limited to the embodiment described above.

Figure 3:
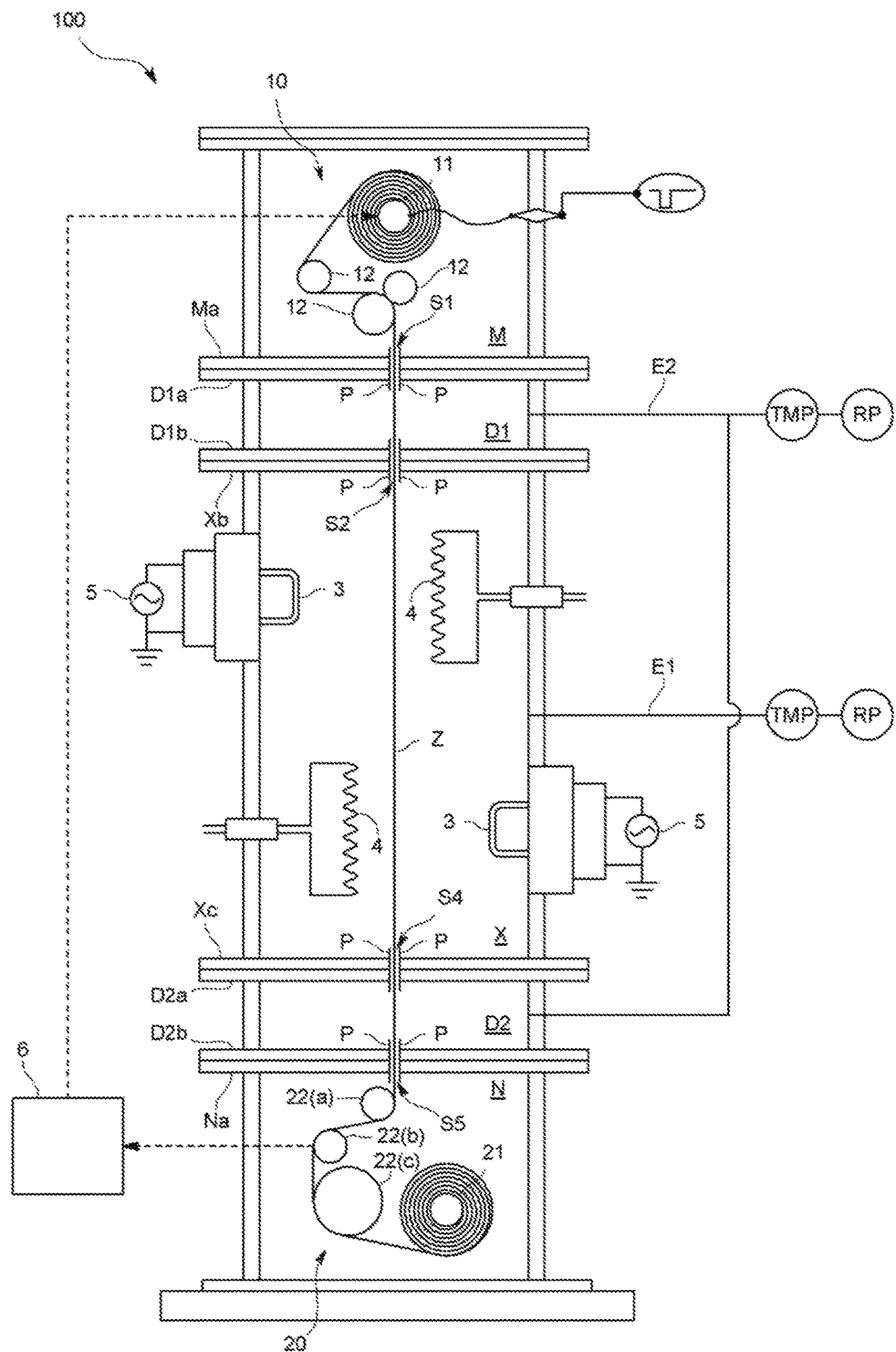
FIG. 3 is a schematic view illustrating a configuration of a plasma treatment apparatus according to another embodiment.

For example, in the above embodiment, two plasma treatment chambers X are arranged in series, but one plasma treatment chamber X may be used as illustrated in FIG. 3. In this case, when the ion implantation performed in the first plasma treatment chamber X of the above-described embodiment is not required, the ion implantation step may be omitted. Also, although not illustrated, three or more plasma treatment chambers X may be provided. Further, the sheet-like base material Z may be treated with plasma in the feeding chamber M.

In the plasma treatment chamber X illustrated in FIG. 3, a pair of high-frequency antennas 3 and a pair of heaters 4 respectively facing the high-frequency antennas 3 are provided, and these high-frequency antennas 3 are provided on one surface side (surface side) and the other surface side (back surface side) of the sheet-like base material Z. Thus, the film can be continuously formed on the surface and the back surface of the sheet-like base material Z.

Further, although the heater 4 is provided in the plasma treatment chamber X of the above-described embodiment, the heater 4 does not necessarily need to be provided in the plasma treatment chamber X. In this case, the reason why the sheet-like base material Z is heated is because ions are implanted into the sheet-like base material Z when a negative DC voltage or a negative pulse voltage is applied to the sheet-like base material Z, and particularly when the sheet-like base material Z is as thin as, for example, about 20 μm, the sheet-like base material Z is easily heated due to a small heat capacity thereof.

Figure 4:
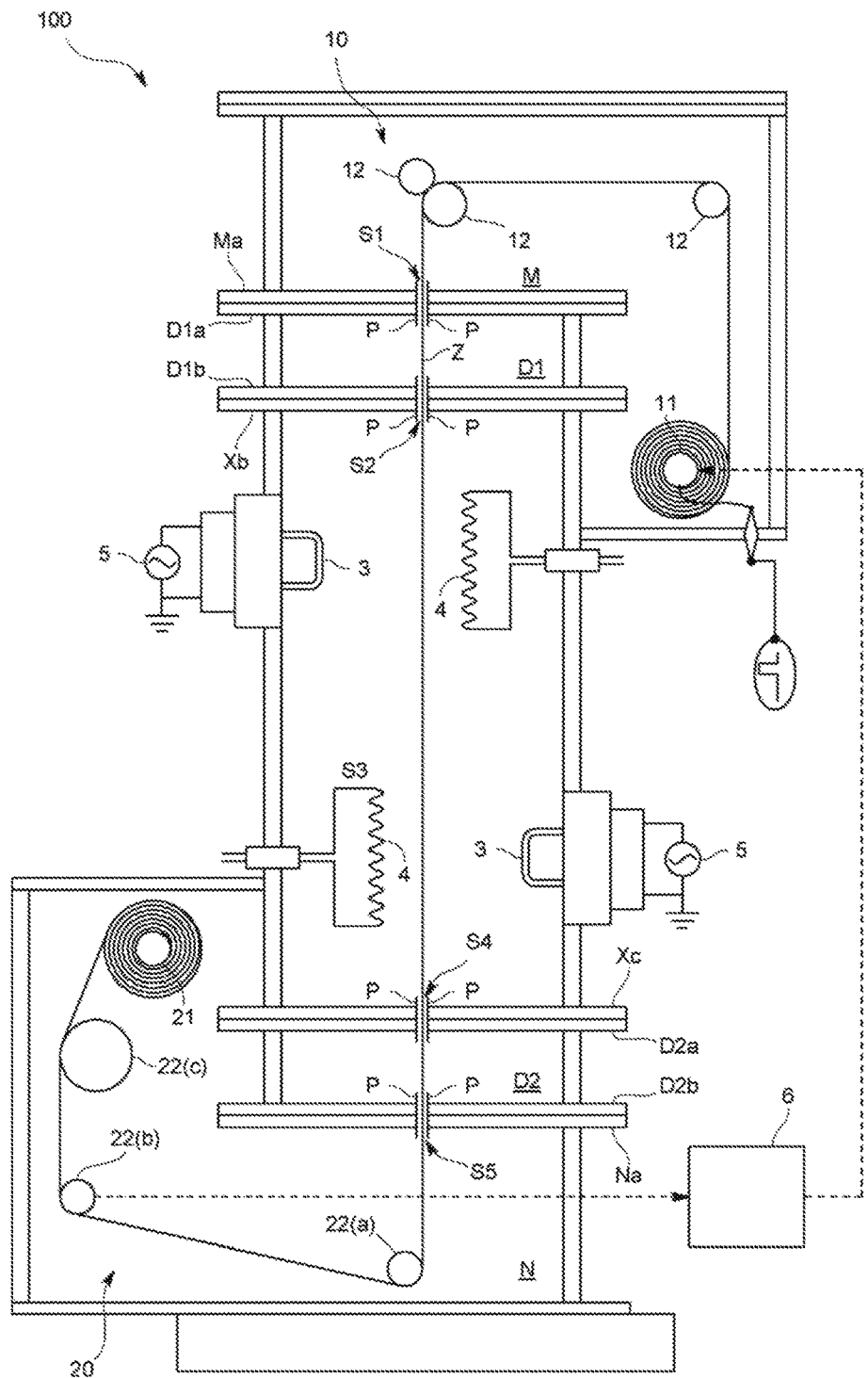
FIG. 4 is a schematic view illustrating a configuration of a plasma treatment apparatus according to another embodiment.

Also, regarding the feeding mechanism 10, as illustrated in FIG. 4, at least a portion of the rollers constituting the feeding mechanism 10, specifically at least one thereof, may be provided above the plasma treatment chamber X. In other words, for example, the feeding roller 11 is not necessarily positioned above the plasma treatment chamber X as illustrated in FIG. 4.

Similarly to the winding mechanism 20, at least a portion of the rollers constituting the winding mechanism 20, specifically at least one thereof, may be provided below the plasma treatment chamber X, and, for example, the winding roller 21 is not necessarily positioned below the plasma treatment chamber X as illustrated in FIG. 4.

Figure 5:
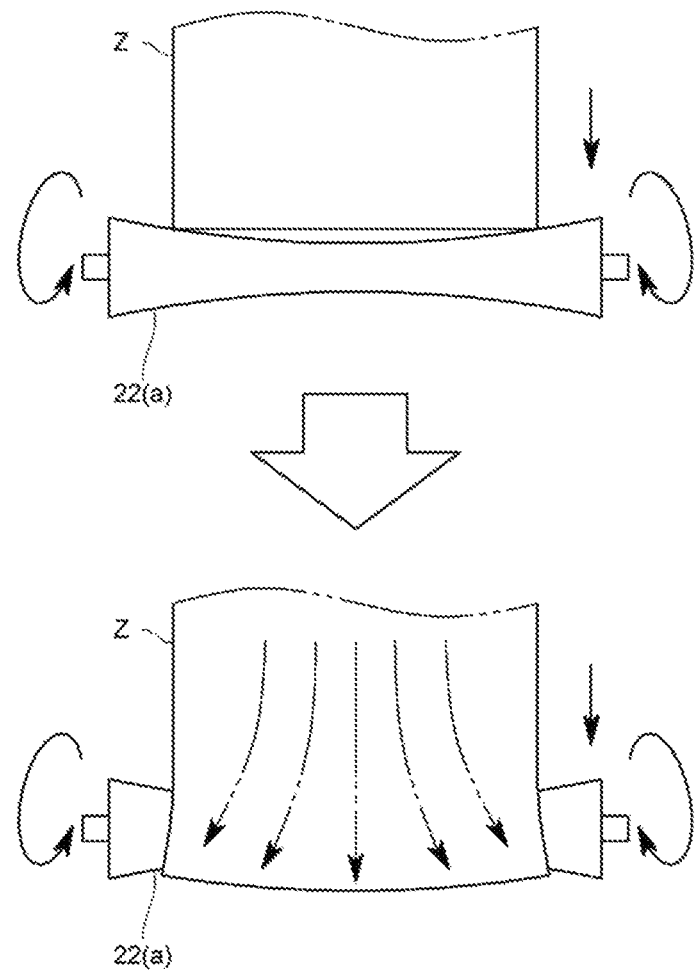
FIG. 5 is a schematic view illustrating a configuration of a first guide roller according to another embodiment.

In the above-described embodiment, the first guide roller 22(a) has been described as being curved to be bulged downward, but the first guide roller 22(a) may have a shape in which an outer diameter of a central portion in an axial direction is smaller than an outer diameter of an end portion in the axial direction as illustrated in FIG. 5.

Figure 6:
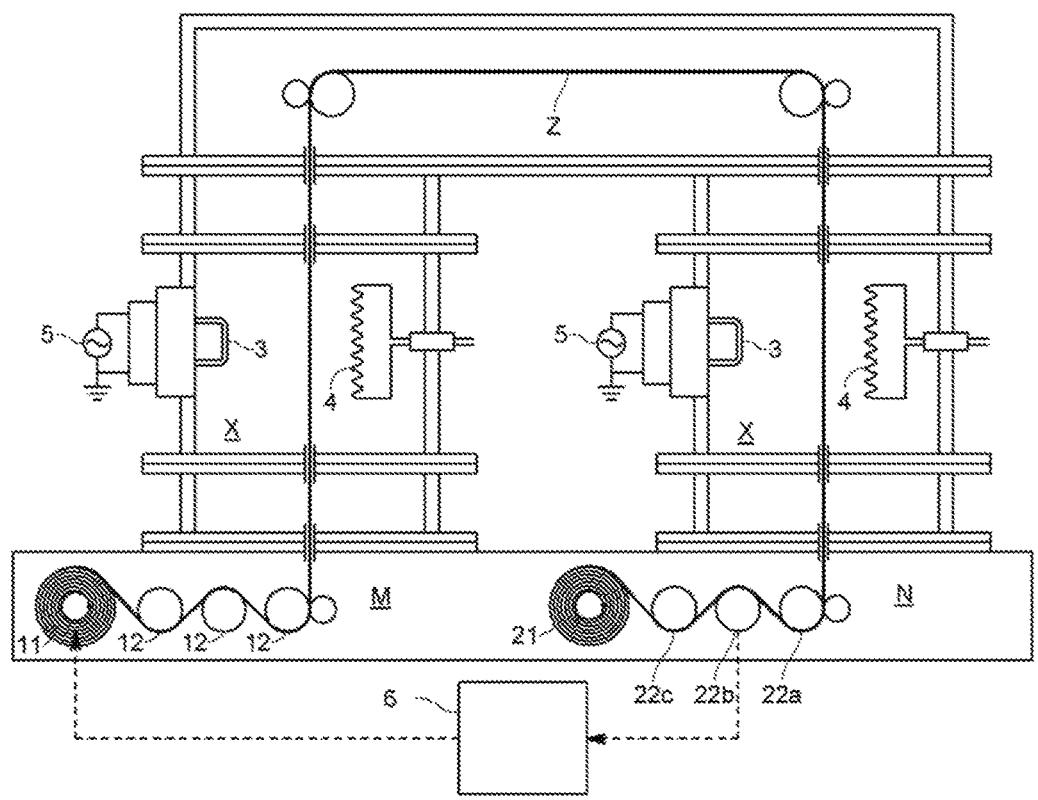
FIG. 6 is a schematic view illustrating a configuration of a plasma treatment apparatus according to another embodiment.

Further, the feeding mechanism 10 is not necessarily provided above the plasma treatment chamber X, and may be provided below the plasma treatment chamber X as illustrated in FIG. 6. That is, the feeding mechanism 10 may feed the sheet-like base material Z into the plasma treatment chamber X in the vertical direction.

With such a configuration, since the feeding mechanism 10 and the winding mechanism 20 are provided below the plasma treatment chamber X, it is possible to simplify work of loading or unloading the sheet-like base material Z to or from the feeding mechanism 10 and the winding mechanism 20.

In addition, the plasma treatment apparatus is configured to feed the sheet-like base material from an upper side to a lower side in the above-described embodiment, but may be configured to feed the sheet-like base material from the lower side to the upper side.

That is, the feeding mechanism 10 may be provided below the plasma treatment chamber X, and the winding mechanism 20 may be provided above the plasma treatment chamber X.

In the above embodiment, nuclei are formed by implantation of carbon ions, but nuclei may be formed by implantation of nitrogen ions.

Further, with omitting the plasma treatment that forms nuclei, or in addition to the plasma treatment that forms nuclei, plasma treatment for removing an oxide film ($Al_2O_3$) of the sheet-like base material may be performed. Specifically, as such a plasma treatment, argon gas cleaning in which an oxide film is removed by introducing, for example, argon gas into the plasma treatment chamber X, maintaining the pressure at 1 Pa, and generating plasma can be exemplified.

In addition, in the above-described embodiment, the sheet-like base material that has been treated with plasma is wound by the winding mechanism 20, but, the winding mechanism 20 is not necessarily provided in the plasma treatment apparatus when the sheet-like base material that has been treated with plasma is cut or folded.

The sheet-like base material is not limited to aluminum, and may be one having at least one metal among nickel (Ni), iron (Fe), magnesium (Mg), titanium (Ti), or an alloy such as stainless steel containing these metals.

The gas barrier film is not limited to the conductive DLC film, and may be a conductive amorphous carbon film as a conductive carbon film, and may be metal carbide film, a metal oxycarbide film, a metal nitride film, a metal boride film, or a metal silicide film, or the like.

Formation of the gas barrier film is not limited to that described in the above-described embodiment, and, for example, a plasma chemical vapor deposition (CVD)

method, a vacuum deposition method, a sputtering method, an ion plating method, or the like may be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A plasma treatment apparatus comprising:
a plasma treatment chamber which treats a sheet-like base material with plasma;
a high-frequency antenna which generates plasma in the plasma treatment chamber;
a feeding mechanism which feeds the sheet-like base material into the plasma treatment chamber in a vertical direction; and
a winding mechanism which winds the sheet-like base material that has passed through the plasma treatment chamber in the vertical direction, wherein
the feeding mechanism and the winding mechanism are provided below the plasma treatment chamber.

2. The plasma treatment apparatus according to claim 1, further comprising:
a winding roller which winds the sheet-like base material; and
a cooling roller which cools the sheet-like base material that has been treated with plasma while guiding the sheet-like base material to the winding roller.

3. The plasma treatment apparatus according to claim 2, further comprising:
a guide roller which guides the sheet-like base material that has been treated with plasma to the cooling roller, wherein
the guide roller is configured to receive an outer end portion in a width direction of the sheet-like base material being lowered first before a center portion in the width direction of the sheet-like base material.

4. A plasma treatment apparatus comprising:
a plasma treatment chamber which treats a sheet-like base material with plasma;
a high-frequency antenna which generates plasma in the plasma treatment chamber;
a feeding mechanism which feeds the sheet-like base material into the plasma treatment chamber in a vertical direction;
a winding roller which winds the sheet-like base material;
a cooling roller which cools the sheet-like base material that has been treated with plasma while guiding the sheet-like base material to the winding roller;
a tension detection mechanism which detects a tension applied to the sheet-like base material by the winding roller; and
a control device which controls at least one of the feeding mechanism and the winding roller on the basis of the tension detected by the tension detection mechanism.

5. The plasma treatment apparatus according to claim 1, wherein a heater which heats the sheet-like base material is provided in the plasma treatment chamber.

6. A plasma treatment apparatus comprising:
a plasma treatment chamber which treats a sheet-like base material with plasma;
a high-frequency antenna which generates plasma in the plasma treatment chamber;
a feeding mechanism which feeds the sheet-like base material into the plasma treatment chamber in a vertical direction;
a slit through which the sheet-like base material is able to pass is formed in facing walls of the plasma treatment chamber facing each other, and
a pair of guide plates which guide transfer of the sheet-like base material is further provided in the slit.

7. A plasma treatment apparatus comprising:
a plasma treatment chamber which treats a sheet-like base material with plasma;
a high-frequency antenna which generates plasma in the plasma treatment chamber;
a feeding mechanism which feeds the sheet-like base material into the plasma treatment chamber in a vertical direction;
a chamber to which a gas different from a raw material gas supplied to the plasma treatment chamber is supplied; and
a decompression chamber interposed between the chamber and the plasma treatment chamber and configured to have a reduced pressure with respect to that of the chamber and the plasma treatment chamber.

* * * * *